United States Patent
Arai et al.

(10) Patent No.: US 7,518,180 B2
(45) Date of Patent: Apr. 14, 2009

(54) NONVOLATILE SEMICONDUCTOR MEMORY DEVICE AND METHOD FOR FABRICATING THE SAME

(75) Inventors: Masatoshi Arai, Nara (JP); Keita Takahashi, Nara (JP)

(73) Assignee: Panasonic Corporation, Osaka (JP)

( * ) Notice: Subject to any disclaimer, the term of this patent is extended or adjusted under 35 U.S.C. 154(b) by 664 days.

(21) Appl. No.: 11/123,169

(22) Filed: May 6, 2005

(65) Prior Publication Data
US 2006/0017121 A1    Jan. 26, 2006

(30) Foreign Application Priority Data
Jul. 20, 2004    (JP) .............................. 2004-212112

(51) Int. Cl.
*H01L 29/00* (2006.01)
(52) U.S. Cl. .................................... 257/321
(58) Field of Classification Search ................ 257/411, 257/315–321, E21.409, E29.001
See application file for complete search history.

(56) References Cited

U.S. PATENT DOCUMENTS

| | | | | |
|---|---|---|---|---|
| 6,768,165 B1 * | 7/2004 | Eitan | ......................... | 257/324 |
| 6,897,518 B1 * | 5/2005 | Park et al. | ................... | 257/315 |
| 7,136,301 B2 * | 11/2006 | Tokumitsu | .................. | 365/184 |
| 2003/0189233 A1 * | 10/2003 | Yamashita | ................... | 257/410 |
| 2005/0037574 A1 * | 2/2005 | Sugiyama | ................... | 438/257 |

FOREIGN PATENT DOCUMENTS

EP           1 313 138 A2       5/2003

* cited by examiner

*Primary Examiner*—Nathan W Ha
(74) *Attorney, Agent, or Firm*—McDermott Will & Emery LLP

(57) ABSTRACT

A nonvolatile semiconductor memory device includes: a gate dielectric made of a multilayer dielectric that is formed on a substrate and discretely accumulates charges; a gate electrode formed on the gate dielectric; a pair of diffusion regions formed in the surface of the substrate with the gate electrode interposed therebetween and serving as a source and a drain; and a channel region existing between the diffusion regions. At least one of regions of the gate dielectric located between the pair of diffusion regions and lateral end parts of the gate electrode opposed to the diffusion regions includes a fixed charge accumulation region in which charges produced by irradiating the gate electrode with ultraviolet light can be accumulated, and at least one said diffusion region located below the fixed charge accumulation region is formed to overlap with the fixed charge accumulation region in plan configuration and extend beyond the fixed charge accumulation region toward the middle of the channel region in plan configuration.

5 Claims, 6 Drawing Sheets

Fixed Carge Accumulation Regions

Fixed Charge Accumulation Regions

Fixed Carge Accumulation Regions

NONVOLATILE SEMICONDUCTOR MEMORY DEVICE AND METHOD FOR FABRICATING THE SAME

CROSS-REFERENCE TO RELATED APPLICATIONS

The disclosure of Japanese Patent Application No. 2004-212112 filed on Jul. 20, 2004 including specification, drawing and claims is incorporated herein by reference in its entirety.

BACKGROUND OF THE INVENTION (1) Field of the Invention

The present invention relates to a nonvolatile semiconductor memory device that discretely accumulates charges in a multilayer dielectric and a method for fabricating the same.

(2) Description of Related Art

In recent years, attention has been directed to nonvolatile semiconductor memory devices that discretely accumulate charges in multilayer dielectrics, because the devices provide high integration and high reliability.

By the way, it has been recognized that these nonvolatile semiconductor memory devices have the problem that the influence of ultraviolet light in a fabrication process of each nonvolatile semiconductor memory device disables control of a threshold voltage, leading to malfunction in writing and erasing operations. This problem will be described hereinafter in detail.

First, a nonvolatile semiconductor memory device according to a first background art will be described with reference to FIG. 5.

FIG. 5 is a cross-sectional view showing a typical nonvolatile semiconductor memory device that discretely accumulates charges in a multilayer dielectric.

As shown in FIG. 5, a multilayer dielectric 101 is formed, as a gate dielectric, by stacking, in bottom-to-top order, a lower oxide film 101a, a silicon nitride film 101b and an upper oxide film 101c on a silicon substrate 100. The multilayer dielectric 101 is used to accumulate charges. A polycrystalline silicon film 102 is formed as a gate electrode on the multilayer dielectric 101. Furthermore, diffusion regions 103 are formed in the surface of the silicon substrate 100 with the gate electrode interposed therebetween.

In a fabrication process of the nonvolatile semiconductor memory device shown in FIG. 5, elements are irradiated with ultraviolet light through various process steps after the formation of the gate electrode (for example, a lithography process step, a dry etching process step using plasma, a chemical vapor deposition (CVD) process step, and other process steps). When the gate electrode or the silicon substrate 100 is irradiated with ultraviolet light, electrons existing in the gate electrode or the silicon substrate 100 are excited. Among the excited electrons, electrons having obtained energy that can go beyond the energy barrier existing between the silicon substrate 100 and the multilayer dielectric 101 or between the gate electrode and the multilayer dielectric 101 are captured in the multilayer dielectric 101. In other words, the electrons captured in the multilayer dielectric 101 are accumulated in regions S1 of the multilayer dielectric 101 located in the vicinity of the ends thereof (hereinafter, referred to as "fixed charge accumulation region S1"). The light energy increases with decrease in wavelength. Therefore, visible light can be ignored.

In the nonvolatile semiconductor memory device shown in FIG. 5, writing and erasing operations are typically performed in the manner in which hot carriers are produced to locally capture charges in the multilayer dielectric 101 and extract the captured charges. More particularly, if electrons are captured in regions P1 of the multilayer dielectric 101 in which a writing or erasing operation is carried out (hereinafter, referred to as "writing/erasing regions P1"), i.e., regions of the multilayer dielectric 101 opposed to the vicinity of the interfaces between the diffusion regions 103 and a channel region existing between the diffusion regions 103, the threshold voltage is increased. On the other hand, if positive holes are captured in the writing/erasing regions P1, the threshold voltage is decreased. In this way, the writing and erasing operations are typically carried out in the writing/erasing regions P1.

However, when as shown in FIG. 5 the fixed charge accumulation regions S1 in which electrons captured in the interlayer dielectric 101 by the influence of ultraviolet light during various process steps are accumulated not only includes the writing/erasing regions P1 but also extends beyond the writing/erasing regions P1 into the surrounding regions of the multilayer dielectric 101, the threshold voltage cannot be changed to a desired value by the writing and erasing operations. The reason for this is that the value of the threshold voltage depends on the electrons captured during the various process steps. In summary, in the nonvolatile semiconductor memory device shown in FIG. 5, the threshold voltage cannot be controlled, and thus it is difficult to perform normal writing and erasing operations.

This problem is becoming more apparent with miniaturization of semiconductor memory devices. The reason for this is as follows: If device miniaturization is carried out according to a scaling law, it is possible to reduce in size the regions where the gate electrode overlaps with the diffusion regions 103, i.e., regions of the diffusion regions 103 located below the gate electrode. However, it is impossible to change in size also the fixed charge accumulation regions S1 of the multilayer dielectric 101 in which electrons are captured and accumulated by the influence of ultraviolet light.

It is needless to say that, even if in the above description electrons and positive holes are replaced with positive holes and electrons, respectively, the same description can be given.

On the other hand, a nonvolatile semiconductor memory device according to a second background art has been suggested to solve malfunction in writing and erasing operations due to the influence of ultraviolet light (see, for example, EP1313138 A2).

FIG. 6 is a cross-sectional view showing the structure of the nonvolatile semiconductor memory device according to the second background art.

In the nonvolatile semiconductor memory device 200A shown in FIG. 6, diffusion bit lines 201 are formed under parts of an oxide film 200, and writing and erasing operations are carried out by capturing charges in a multilayer film 202 obtained by successively stacking a silicon oxide film, a silicon nitride film and a silicon oxide film. According to the second background art, as shown in FIG. 6, a protective film (light shielding film) 203 is formed on memory elements to shield ultraviolet light, thereby performing normal writing and erasing operations.

However, the nonvolatile semiconductor memory device 200A according to the second background art has the following problems.

First, it is impossible to restrain charges from being captured in the multilayer dielectric by the influence of ultraviolet light in process steps until the formation of a light shielding film. More particularly, it is impossible to eliminate the influence of ultraviolet light produced in process steps from the formation of the multilayer dielectric to the formation of the light shielding film, because the light shielding film cannot be formed before the completion of memory cells.

Second, when contacts are to be formed everywhere in a memory cell array, short circuits may be caused through the contacts, because holes need be formed in the light shielding film to form the contacts. Thus, it is difficult to form contacts.

Third, since the light shielding film is formed in layers, the fabrication cost is increased.

SUMMARY OF THE INVENTION

In view of the above, it is an object of the present invention to provide a nonvolatile semiconductor memory device that discretely accumulates charges in a multilayer dielectric and, even if the device is irradiated with ultraviolet light, can control a threshold voltage without increasing the fabrication cost and a method for fabricating the same.

In order to achieve the above object, the present inventors variously studied a mechanism for accumulating charges in the multilayer dielectric by the influence of ultraviolet light. As a result, they found the following.

When a nonvolatile semiconductor memory device has the same structure as that of the nonvolatile semiconductor memory device shown in FIG. 5, electrons are excited only in the vicinity of the ends of a gate electrode, resulting in electrons captured in a multilayer dielectric.

The reason for this is as follows. Polycrystalline silicon used for the gate electrode absorbs ultraviolet light. Ultraviolet light applied to the top of the gate electrode attenuates in the gate electrode and thus does not reach the multilayer dielectric. On the other hand, part of ultraviolet light applied to the side surfaces of the gate electrode reaches within regions at some distance from the side surfaces, so that electrons produced in the regions of the gate electrode may be captured in the multilayer dielectric.

After further studies of the mechanism, the present inventors found that when polycrystalline silicon is used as a gate electrode, regions of the multilayer dielectric in which electrons can be captured are those approximately 60 nm distant from the side surfaces of the multilayer dielectric toward the middle thereof.

FIG. 7 shows threshold voltages of a completed nonvolatile semiconductor memory device of the structure shown in FIG. 6 in correspondence with different thicknesses of polycrystalline silicon used as a light shielding film when the thickness of the polycrystalline silicon is changed.

As clear from FIG. 7, when the thickness of the polycrystalline silicon serving as the light shielding film is less than approximately 60 nm, the threshold voltage rapidly increases. This means that, when the thickness of the polycrystalline silicon is less than approximately 60 nm, ultraviolet light passes through the polycrystalline silicon.

In view of the above, the present inventors found that, when a nonvolatile semiconductor memory device has the same structure as the nonvolatile semiconductor memory device shown in FIG. 5 and polycrystalline silicon is used as its gate electrode, ultraviolet light reaches within regions of the gate electrode at most 60 nm distant from the side surfaces of the gate electrode toward the middle thereof. Some of electrons excited in the regions of the gate electrode reached by ultraviolet light can be captured in regions of the multilayer dielectric at most 60 nm distant from the side surfaces of the multilayer dielectric toward the middle thereof. When polycrystalline silicon is used as a gate electrode and the thickness of the gate electrode is less than 60 nm, a nonvolatile semiconductor memory device having this gate electrode does not function as an effective device, because ultraviolet light passes through the whole gate electrode.

The present invention is made in view of the above, and, more specifically, a nonvolatile semiconductor memory device of the present invention includes: a gate dielectric made of a multilayer dielectric that is formed on a substrate and discretely accumulates charges; a gate electrode formed on the gate dielectric; a pair of diffusion regions formed in the surface of the substrate with the gate electrode interposed therebetween and serving as a source and a drain; and a channel region existing between the diffusion regions, wherein at least one of regions of the gate dielectric located between the pair of diffusion regions and lateral end parts of the gate electrode opposed to the diffusion regions includes a fixed charge accumulation region in which charges produced by irradiating the gate electrode with ultraviolet light can be accumulated, and at least one said diffusion region located below the fixed charge accumulation region is formed to overlap with the fixed charge accumulation region in plan configuration and extend beyond the fixed charge accumulation region toward the middle of the channel region in plan configuration.

According to the nonvolatile semiconductor memory device of the present invention, when electrons are captured into the fixed charge accumulation region of the multilayer dielectric, the diffusion layer serving as the source or the drain exists below the fixed charge accumulation region. Therefore, the threshold voltage is hardly affected by the captured electrons. This allows the threshold voltage to easily be controlled. Furthermore, since unlike the known example an ultraviolet-light shielding film need not be formed, the fabrication cost can be reduced.

In the nonvolatile semiconductor memory device of the present invention, a region of the gate dielectric opposed to the vicinity of the interface between the channel region and the at least one diffusion region is preferably a region thereof in which charges are accumulated by a writing operation or a region thereof in which charges to be extracted by an erasing operation are accumulated.

Thus, writing/erasing regions of the nonvolatile semiconductor memory device are hardly affected by electrons captured into the fixed charge accumulation region. This allows the threshold voltage to be controlled with more stability.

In the nonvolatile semiconductor memory device of the present invention, the at least one diffusion region located below the fixed charge accumulation region and the gate electrode preferably overlap each other by 60 nm or more in plan configuration.

Thus, the fixed charge accumulation region has a width of approximately 60 nm from the associated side surface of the multilayer dielectric toward the middle thereof, and the at least one diffusion region existing below the fixed charge accumulation region overlaps with the gate electrode by 60 nm or more. This allows the threshold voltage to easily be controlled. Therefore, the threshold voltage is controlled with more stability.

In the nonvolatile semiconductor memory device of the present invention, the gate dielectric is preferably made of a multilayer film obtained by successively stacking a silicon oxide film, a silicon nitride film and a silicon oxide film.

This provides a multilayer dielectric with excellent charge retention characteristics.

In the nonvolatile semiconductor memory device of the present invention, it is preferable that the gate electrode is made of polycrystalline silicon and has a thickness of 60 nm or more.

A method for fabricating a nonvolatile semiconductor memory device of a first aspect of the present invention includes the steps of: forming, on a substrate, a gate dielectric made of a multilayer dielectric for discretely accumulating charges; forming a conductive film on the gate dielectric; forming a gate electrode by selectively etching the conductive film; implanting ions into the substrate substantially along the direction of the normal to the surface of the substrate using the gate electrode as a mask, thereby forming, in the surface of the substrate, a pair of diffusion regions serving as a source and a drain and a channel region existing between the diffusion regions; and performing heat treatment to extend the diffusion regions, wherein at least one of regions of the gate dielectric located between the pair of diffusion regions and lateral end parts of the gate electrode opposed to the diffusion regions includes a fixed charge accumulation region in which charges produced by irradiating the gate electrode with ultraviolet light can be accumulated, and the step of performing heat treatment includes the step of extending at least one said diffusion region located below the fixed charge accumulation region to overlap with the fixed charge accumulation region in plan configuration and extend beyond the fixed charge accumulation region toward the middle of the channel region in plan configuration.

According to the method for fabricating the nonvolatile semiconductor memory device of the first aspect of the present invention, when electrons are captured into the fixed charge accumulation region of the multilayer dielectric, the diffusion layer serving as the source or the drain exists below the fixed charge accumulation region. Therefore, the threshold voltage is hardly affected by the captured electrons. This allows the threshold voltage to easily be controlled. Furthermore, since unlike the known example an ultraviolet-light shielding film need not be formed, the fabrication cost can be reduced.

A method for fabricating a nonvolatile semiconductor memory device of a second aspect of the present invention includes the steps of: forming, on a substrate, a gate dielectric made of a multilayer dielectric for discretely accumulating charges; forming a conductive film on the gate dielectric; forming a gate electrode by selectively etching the conductive film; and implanting ions into the substrate at an inclination of 20 degrees or more relative to the direction of the normal to the surface of the substrate using the gate electrode as a mask, thereby forming, in the surface of the substrate, a pair of diffusion regions serving as a source and a drain and a channel region existing between the diffusion regions, wherein at least one of regions of the gate dielectric located between the pair of diffusion regions and lateral end parts of the gate electrode opposed to the diffusion regions includes a fixed charge accumulation region in which charges produced by irradiating the gate electrode with ultraviolet light can be accumulated, and the step of forming the diffusion regions includes the step of extending at least one said diffusion regions located below the fixed charge accumulation regions to overlap with the fixed charge accumulation region in plan configuration and extend beyond the fixed charge accumulation region toward the middle of the channel region in plan configuration.

According to the method for fabricating the nonvolatile semiconductor memory device of the second aspect of the present invention, when electrons are captured into the fixed charge accumulation region of the multilayer dielectric, the diffusion layer serving as the source or the drain exists below the fixed charge accumulation region. Therefore, the threshold voltage is hardly affected by the captured electrons. This allows the threshold voltage to easily be controlled. Furthermore, since unlike the known example an ultraviolet-light shielding film need not be formed, the fabrication cost can be reduced. Furthermore, the above-mentioned effects can be obtained through a smaller number of process steps as compared with the fabrication method of the nonvolatile semiconductor memory device of the first aspect.

In the method of the first or second aspect of the present invention, it is preferable that charges are accumulated in a region of the gate dielectric opposed to the vicinity of the interface between the channel region and the at least one diffusion region by a writing operation and extracted therefrom by an erasing operation.

Thus, writing/erasing regions of the nonvolatile semiconductor memory device are hardly affected by electrons captured into the fixed charge accumulation region. This allows the threshold voltage to be controlled with more stability.

In the method of the first or second aspect of the present invention, the at least one diffusion region located below the fixed charge accumulation region and the gate electrode preferably overlap each other by 60 nm or more.

Thus, the fixed charge accumulation region has a width of approximately 60 nm from the associated side surface of the multilayer dielectric toward the middle thereof, and the at least one diffusion region existing below the fixed charge accumulation region overlaps with the gate electrode by 60 nm or more. This allows the threshold voltage to easily be controlled. Therefore, the threshold voltage is controlled with more stability.

In the method of the first or second aspect of the present invention, the gate dielectric is preferably obtained by successively stacking a silicon oxide film, a silicon nitride film and a silicon oxide film.

This provides a multilayer dielectric with excellent charge retention characteristics.

In the method of the first or second aspect, it is preferable that the gate electrode is made of polycrystalline silicon and has a thickness of 60 nm or more.

As seen from the above, according to the nonvolatile semiconductor memory device of the present invention and the method for fabricating the same, when electrons are captured into the fixed charge accumulation region of the multilayer dielectric, the diffusion layer serving as the source or the drain exists below the fixed charge accumulation region. Therefore, the threshold voltage is hardly affected by the captured electrons. This allows the threshold voltage to easily be controlled. Furthermore, since unlike the known example an ultraviolet-light shielding film need not be formed, the fabrication cost can be reduced.

DETAILED DESCRIPTION OF THE INVENTION

Embodiments of the present invention will be described hereinafter with reference to the drawings.

Embodiment 1

A method for fabricating a nonvolatile semiconductor memory device according to a first embodiment of the present invention will be described hereinafter with reference to FIGS. 1A through 1F.

FIGS. 1A through 1F are cross-sectional views showing process steps in the method for fabricating a nonvolatile semiconductor memory device according to the first embodiment of the present invention.

Figure 1A:
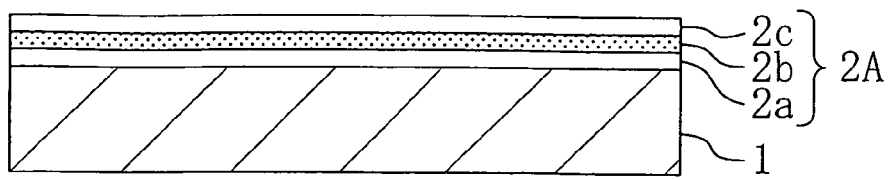
FIGS. 1A through 1F are cross-sectional views showing process steps in a method for fabricating a nonvolatile semiconductor memory device according to a first embodiment of the present invention.

First, as shown in FIG. 1A, a 7-nm-thick lower oxide film 2a is formed over the entire surface of a silicon substrate 1 by heat treatment at 900° C. in an oxidizing atmosphere. Next, a 7-nm-thick silicon nitride film 2b is formed on the lower oxide film 2a by low-pressure chemical vapor deposition (LPCVD) at 700° C. Subsequently, a 12-nm-thick upper oxide film 2c is formed on the silicon nitride film 2b by heat treatment at 1000° C. in an oxidizing atmosphere. In this way, a multilayer dielectric 2A is formed as an ONO film composed of the lower oxide film 2a, the silicon nitride film 2b and the upper oxide film 2c.

Figure 1B:
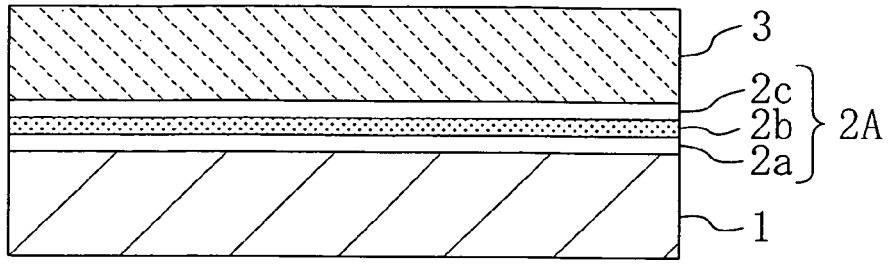

Next, as shown in FIG. 1B, a 200-nm-thick polycrystalline silicon film 3 is formed on the multilayer dielectric 2A by LPCVD at 600° C.

Figure 1C:
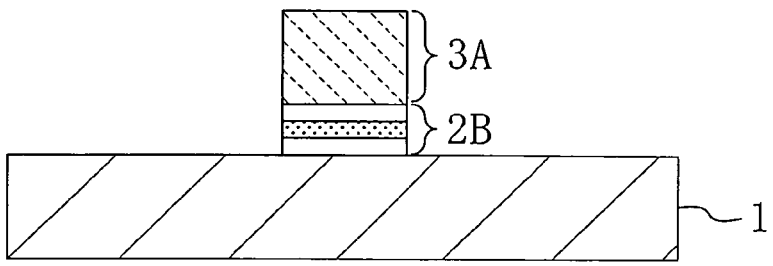

Next, as shown in FIG. 1C, a gate electrode 3A is formed by selectively etching the polycrystalline silicon film 3. In this case, as shown in FIG. 1C, the multilayer dielectric 2A may be formed into a patterned multilayer dielectric 2B by etching in the process step of forming the gate electrode 3A. Alternatively, a patterned multilayer dielectric 2B may be formed in a different process step from the process step of forming the gate electrode 3A.

Figure 1D:
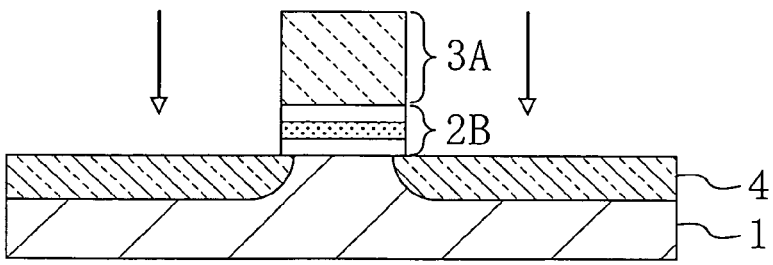

Subsequently, as shown in FIG. 1D, arsenic ions are implanted into the silicon substrate 1 using the gate electrode 3A as a mask, for example, along the direction of the normal to the principal surface of the silicon substrate 1 (at an inclination of 0° relative to the direction of the normal) at an implantation energy of 30 KeV and an implant dose of $3 \times 10^{15}$ atoms/cm$^{-2}$, thereby forming source/drain diffusion regions 4 serving as a source and a drain in the surface of the silicon substrate 1.

Figure 1E:
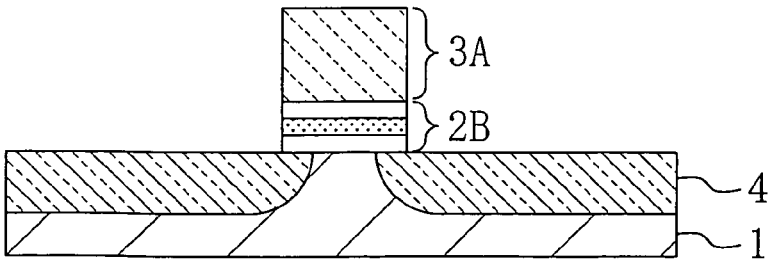

Next, as shown in FIG. 1E, impurities of the source/drain diffusion regions 4 are diffused into the silicon substrate 1, for example, by performing heat treatment at 900° C. for 30 minutes in a nitrogen atmosphere. In this case, as shown in FIG. 1E, impurities of the source/drain diffusion regions 4 are diffused into the silicon substrate 1 such that regions of the source/drain diffusion regions 4 overlapping with the gate electrode 3A each have a width of 60 nm or more, i.e., such that the source/drain diffusion regions 4 and the gate electrode 3A overlap each other by 60 nm or more in plan configuration.

Figure 1F:
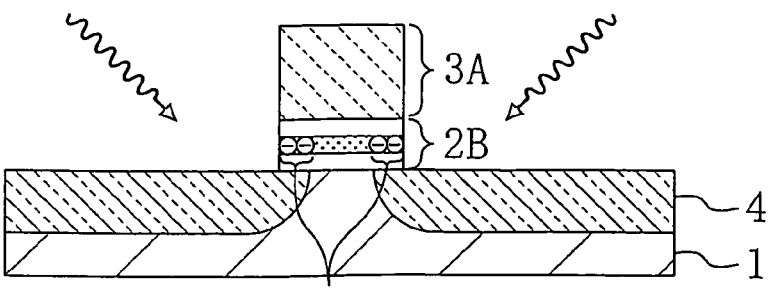

Next, as shown in FIG. 1F, in subsequent process steps, as described above, electrons excited by irradiating the gate electrode 3A with ultraviolet light are captured in the multilayer dielectric 2B so as to be accumulated in fixed charge accumulation regions. As described above, these fixed charge accumulation regions are regions of the multilayer dielectric 2B having a maximum width of 60 nm from the side surfaces of the multilayer dielectric 2B toward the middle thereof.

In this embodiment, a description was given of the case where the multilayer dielectric 2A is the ONO film composed of the lower oxide film 2a, the silicon nitride film 2b and the upper oxide film 2c. However, the multilayer dielectric 2A may be a single-layer film made of a silicon nitride film or a multilayer film made of a lower oxide film and a silicon nitride film.

Furthermore, although in this embodiment an N-channel type transistor is formed, a P-channel type transistor may be formed.

Figure 2A:
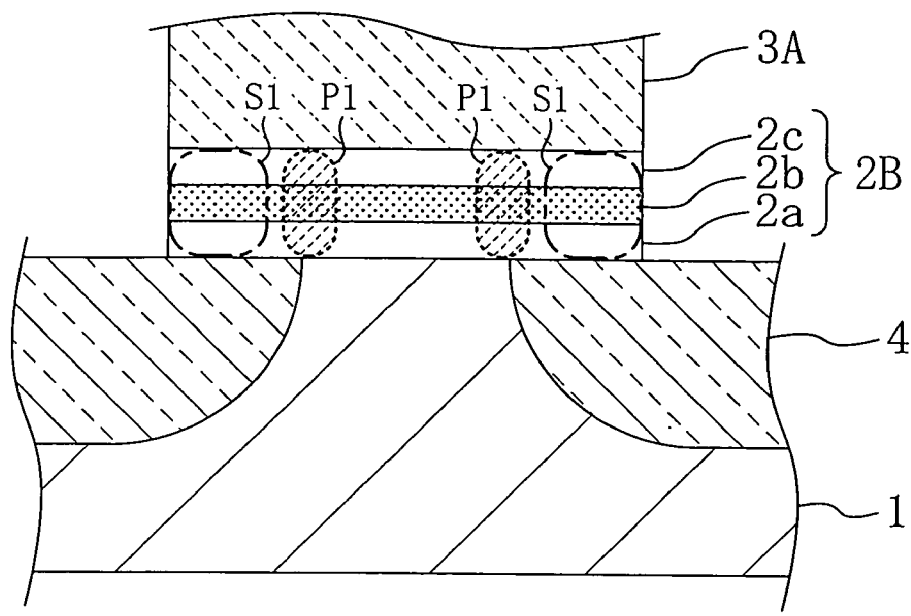
FIGS. 2A and 2B are cross-sectional views schematically showing the spatial relationship between fixed charge accumulation regions and writing/erasing regions in the nonvolatile semiconductor memory device according to the first embodiment and a nonvolatile semiconductor memory device according to a second embodiment of the present invention.
Figure 2B:
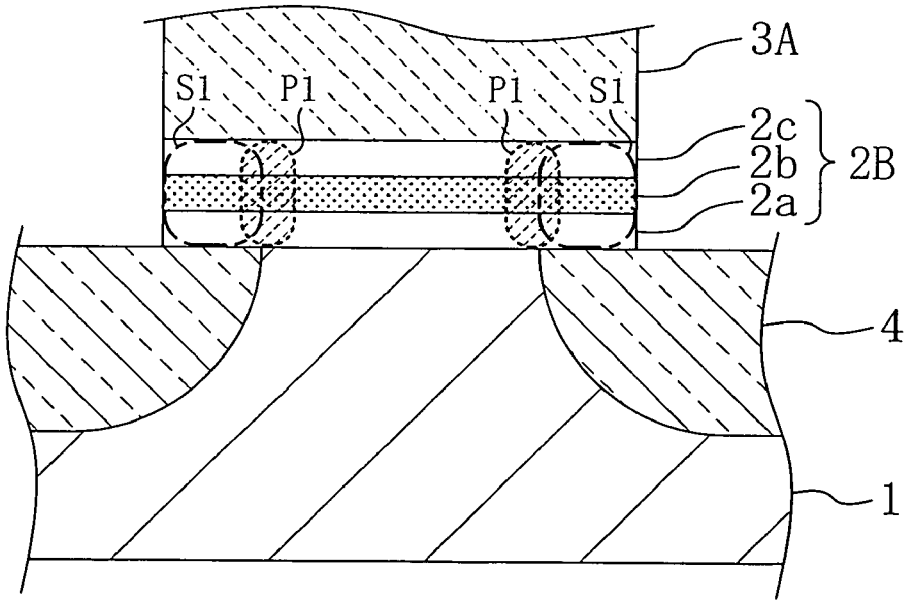

FIGS. 2A and 2B are cross-sectional views schematically showing the structures of nonvolatile semiconductor memory devices for explaining effects of this embodiment.

FIG. 2A is a schematic view of the nonvolatile semiconductor memory device when the source/drain diffusion regions 4 are diffused into a silicon substrate 1 to overlap with fixed charge accumulation regions S1 of the multilayer dielectric 2B in plan configuration and extend, in plan configuration, significantly beyond the fixed charge accumulation regions S1 toward the middle of a channel region of the silicon substrate 1 existing between the source/drain diffusion regions 4. In this case, as shown in FIG. 2A, the fixed charge accumulation regions S1 where electrons produced by the influence of ultraviolet light are accumulated are separated from writing/erasing regions P1 of the multilayer dielectric 2B in which writing/erasing operations are carried out. This allows a threshold voltage of the nonvolatile semiconductor memory device to easily be controlled without any influence of ultraviolet light. Therefore, the nonvolatile semiconductor memory device can be operated normally.

FIG. 2B is a schematic view of the nonvolatile semiconductor memory device when the source/drain diffusion regions 4 are diffused into the silicon substrate 1 to overlap, in plan configuration, fixed charge accumulation regions S1 of the multilayer dielectric 2B and slightly extend, in plan configuration, toward the middle of a channel region of the silicon substrate 1 existing between the source/drain diffusion regions 4 and slightly beyond the fixed charge accumulation regions S1. In this case, although as shown in FIG. 2B the fixed charge accumulation regions S1 in which electrons produced by the influence of ultraviolet light are accumulated partly overlap with the writing/erasing regions P1, the threshold voltage of the nonvolatile semiconductor memory device is hardly influenced by ultraviolet light. This allows a threshold voltage of the nonvolatile semiconductor memory device to easily be controlled. Therefore, the nonvolatile semiconductor memory device can be operated normally.

According to the nonvolatile semiconductor memory device of this embodiment, since unlike the known example an ultraviolet-light shielding film need not be formed, this reduces the fabrication cost.

When a nonvolatile semiconductor memory device has the structure shown in FIG. 2B, the difference between the length of a processed gate and the effective gate length can be made small. Therefore, this structure is excellent for microfabrication.

Embodiment 2

A method for fabricating a nonvolatile semiconductor memory device according to a second embodiment of the present invention will be described hereinafter with reference to FIGS. 3A through 3E.

FIGS. 3A through 3E are cross-sectional views showing process steps in a method for fabricating a nonvolatile semiconductor memory device according to the second embodiment of the present invention.

Figure 3A:
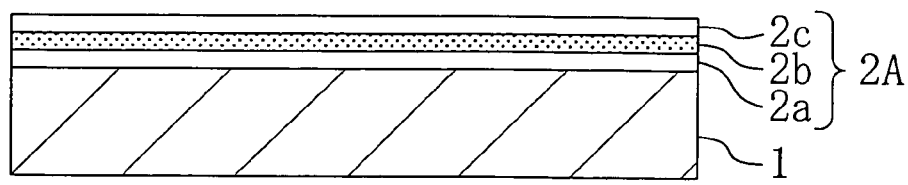
FIGS. 3A through 3E are cross-sectional views showing process steps in a method for fabricating a nonvolatile semiconductor memory device according to the second embodiment of the present invention.

First, as shown in FIG. 3A, a 7-nm-thick lower oxide film 2a is formed over the entire surface of a silicon substrate 1 by heat treatment at 900° C. in an oxidizing atmosphere. Next, a 7-nm-thick silicon nitride film 2b is formed on the lower oxide film 2a by LPCVD at 700° C. Subsequently, a 12-nm-thick upper oxide film 2c is formed on the silicon nitride film 2b by heat treatment at 1000° C. in an oxidizing atmosphere. In this way, a multilayer dielectric 2A is formed as an ONO film composed of the lower oxide film 2a, the silicon nitride film 2b and the upper oxide film 2c.

Figure 3B:
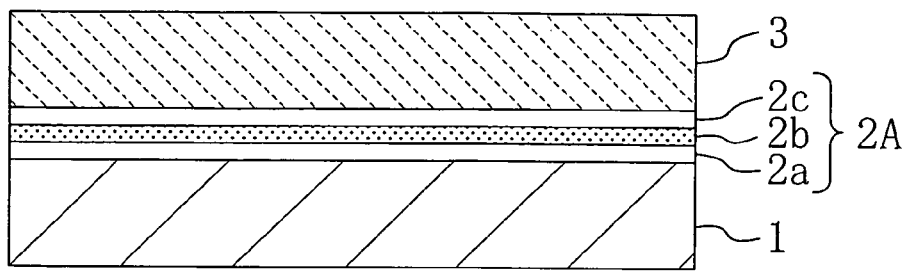

Next, as shown in FIG. 3B, a 200-nm-thick polycrystalline silicon film 3 is formed on the multilayer dielectric 2A by LPCVD at 600° C.

Figure 3C:
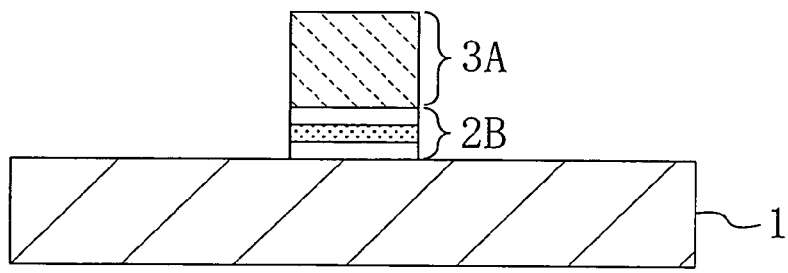

Next, as shown in FIG. 3C, a gate electrode 3A is formed by selectively etching the polycrystalline silicon film 3. In this case, as shown in FIG. 3C, a multilayer dielectric 2B may be patterned by etching the multilayer dielectric 2A in the process step of forming the gate electrode 3A. Alternatively, a multilayer dielectric 2B may be patterned in a different process step from the process step of forming the gate electrode 3A.

Figure 3D:
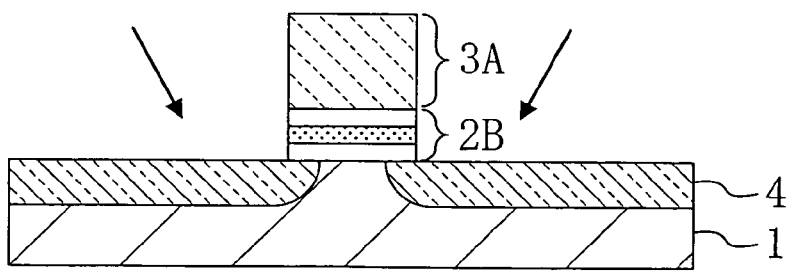

Subsequently, as shown in FIG. 3D, arsenic ions are implanted into the silicon substrate 1 using the gate electrode 3A as a mask, for example, at an inclination of 20° relative to the direction of the normal to the principal surface of the silicon substrate 1, an implantation energy of 30 KeV and an implant dose of $3 \times 10^{15}$ atoms/cm$^{-2}$, thereby forming source/drain diffusion regions 4 serving as a source and a drain in the surface of the silicon substrate 1. When ions are thus implanted into the silicon substrate 1 at an inclination of 20° relative to the direction of the normal to the principal surface of the silicon substrate 1, impurities of the source/drain diffusion regions 4 are diffused into the silicon substrate 1 such that the source/drain diffusion regions 4 overlap with the gate electrode 3A by 60 nm or more in plan configuration. In this way, the source/drain diffusion regions 4 exist below fixed charge accumulation regions having a maximum width of 60 nm from the side surfaces of the multilayer dielectric 2B toward the middle thereof. Therefore, the threshold voltage is hardly influenced by the influence of charges accumulated in the fixed charge accumulation regions. This allows the threshold voltage to easily be controlled.

Figure 3E:
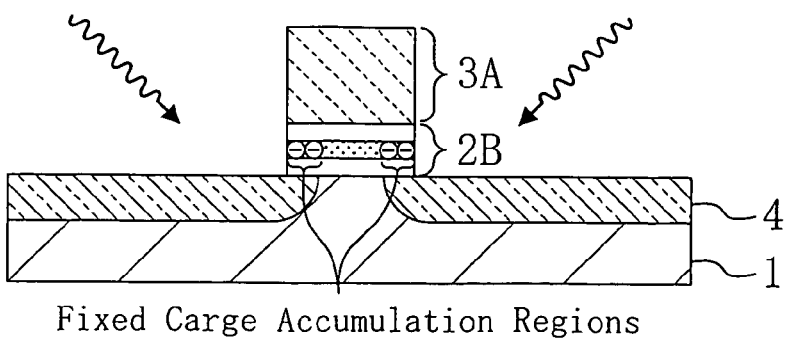

Next, as shown in FIG. 3E, in subsequent process steps, as described above, electrons excited by irradiating the gate electrode 3A with ultraviolet light are captured in the multilayer dielectric 2B so as to be accumulated in the fixed charge accumulation regions. As described above, these fixed charge accumulation regions are regions of the multilayer dielectric 2B having a maximum width of 60 nm from the side surfaces of the multilayer dielectric 2B toward the middle thereof.

In this embodiment, a description was given of the case where the multilayer dielectric 2A is the ONO film composed of the lower oxide film 2a, the silicon nitride film 2b and the upper oxide film 2c. However, the multilayer dielectric 2A may be a single-layer film made of a silicon nitride film or a multilayer film made of a lower oxide film and a silicon nitride film.

Furthermore, although in this embodiment an N-channel type transistor is formed, a P-channel type transistor may be formed.

Effects of this embodiment will be described hereinafter.

Also in this embodiment, like the structure of the nonvolatile semiconductor memory device shown in FIG. 2A or 2B, the source/drain diffusion regions 4 can be formed to overlap, in plan configuration, the fixed charge accumulation regions of the multilayer dielectric 2B and extend, in plan configuration, toward the middle of a channel region existing between the source/drain diffusion regions 4 and beyond the fixed charge accumulation regions. Therefore, the fixed charge accumulation regions where electrons produced by the influence of ultraviolet light can be accumulated and writing/erasing regions of the multilayer dielectric in which writing/erasing operations are carried out are separated or partly overlap. Hence, as described above, a threshold voltage of the nonvolatile semiconductor memory device can easily be controlled with the influence of ultraviolet light eliminated. Accordingly, the nonvolatile semiconductor memory device can be operated normally.

According to the nonvolatile semiconductor memory device of this embodiment, since unlike the known example an ultraviolet-light shielding film need not be formed, the fabrication cost can be reduced. Furthermore, the number of fabrication process steps can be reduced as compared with the first embodiment.

When a nonvolatile semiconductor memory device has a structure in which the fixed charge accumulation regions partly overlap with the regions of the multilayer dielectric in which writing/erasing operations are carried out, the difference between the length of a processed gate and the effective gate length can be made small. This structure is excellent in use for microfabrication.

Embodiment 3

In a third embodiment of the present invention, modifications of the first and second embodiments will be described with reference to FIGS. 4A through 4C.

Figure 4A:
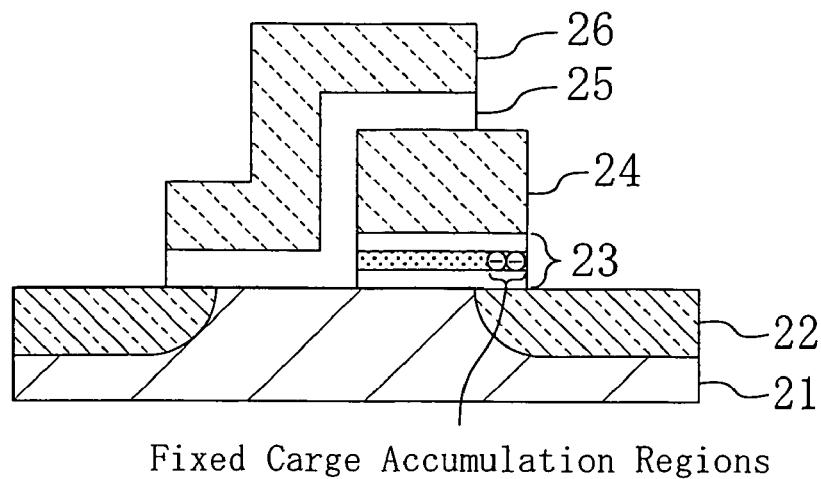
FIGS. 4A through 4C are cross-sectional views showing the structure of a nonvolatile semiconductor memory device according to a third embodiment of the present invention.

First, FIG. 4A is a cross-sectional view of a nonvolatile semiconductor memory device when a fixed charge accumulation region is formed only below one of the lateral end parts of a gate electrode opposed to source/drain diffusion regions.

As shown in FIG. 4A, source/drain diffusion regions 22 are formed in the surface of a silicon substrate 21. A multilayer dielectric 23 containing a silicon nitride film and a polycrystalline silicon film 24 are successively formed on the silicon substrate 21 and the source/drain diffusion regions 22. In this modification, the source/drain diffusion regions 22 are formed to overlap, in plan configuration, with the gate electrode by 60 nm or more only below one of the lateral end parts of the gate electrode opposed to the source/drain diffusion regions 22. A silicon oxide film 25 and a polycrystalline silicon film 26 are successively formed on the silicon substrate 21 and the source/drain diffusion regions 22 to cover part of the gate electrode.

Figure 4B:
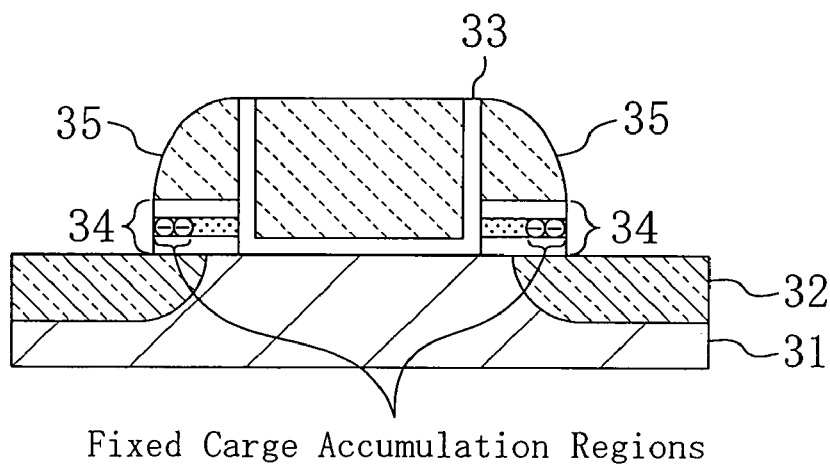

Next, FIG. 4B is a cross-sectional view of a nonvolatile semiconductor memory device when a multilayer dielectric is formed only below the lateral end parts of the gate electrode opposed to source/drain diffusion regions and fixed charge accumulation regions are formed in the multilayer dielectric.

As shown in FIG. 4B, source/drain diffusion regions 32 are formed in the surface of the silicon substrate 31. A recessed silicon oxide film 33 is formed on the silicon substrate 31, and a polycrystalline silicon film 35 is formed inside the silicon oxide film 33. Furthermore, a multilayer dielectric 34 containing a silicon nitride film and another polycrystalline film 35 are successively formed on the silicon substrate 31 and the source/drain diffusion regions 32 and outside the recessed silicon oxide film 33. In this modification, the source/drain diffusion regions 32 are formed below the lateral end parts of the gate electrode opposed the source/drain diffusion regions 32 to overlap with the gate electrode by 60 nm or more in plan configuration.

Figure 4C:
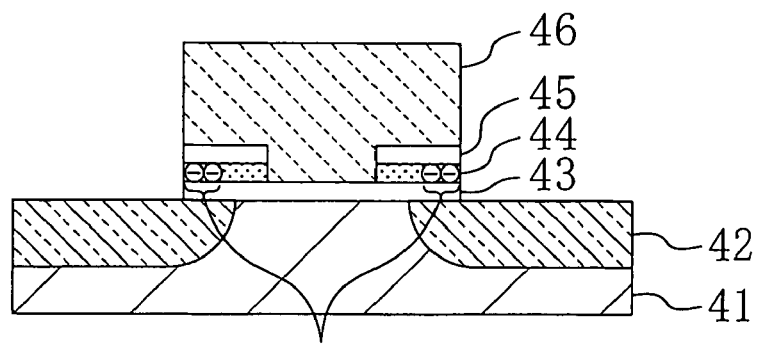
Figure 5:
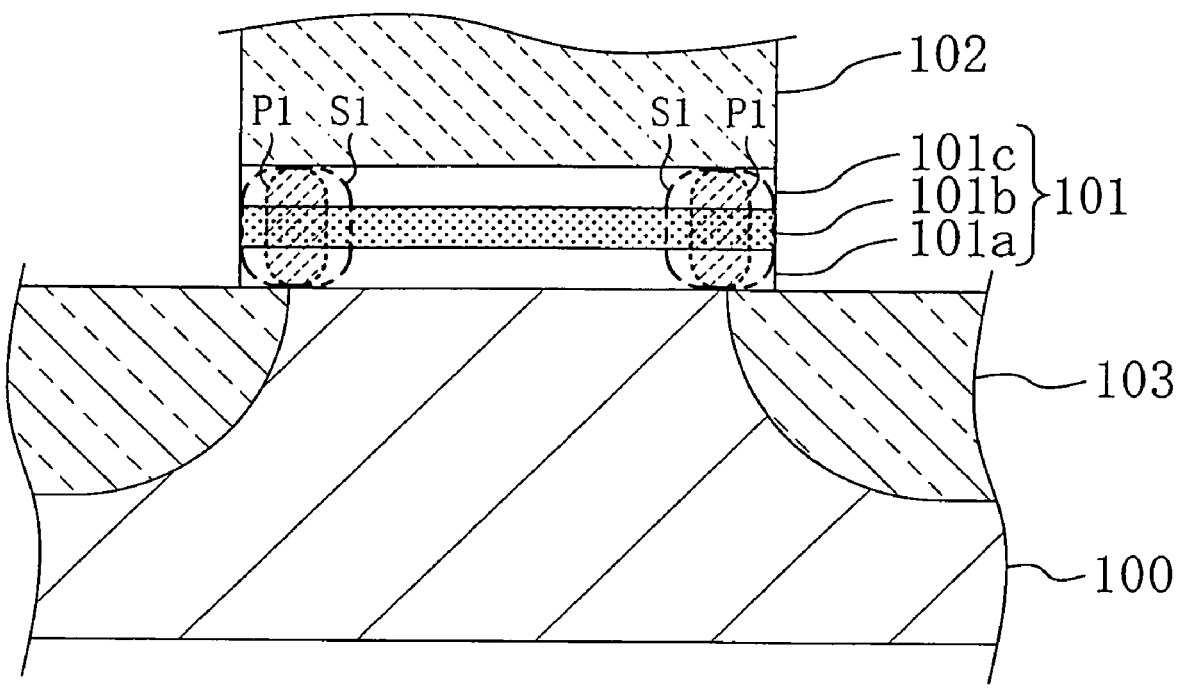
FIG. 5 is a cross-sectional view showing the structure of a nonvolatile semiconductor memory device according to a first background art.
Figure 6:
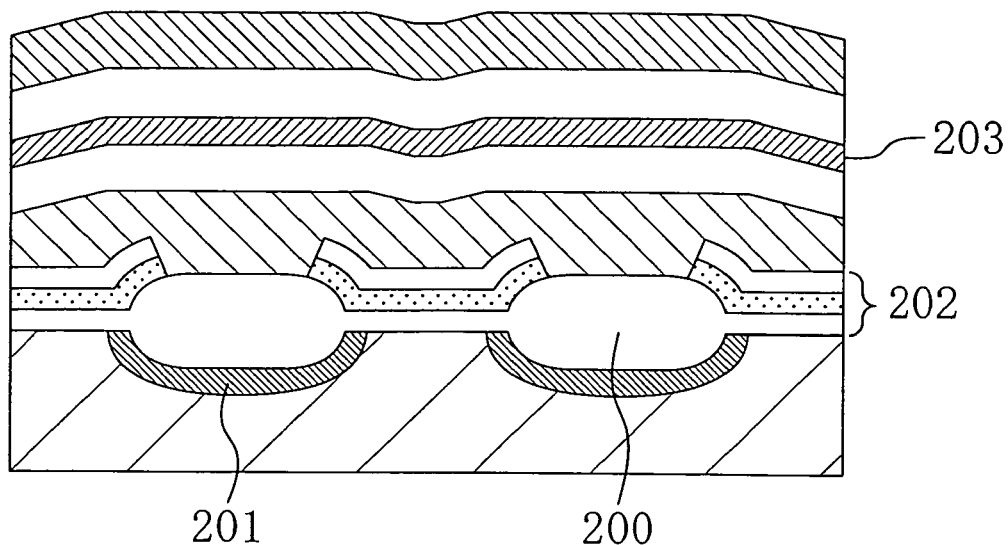
FIG. 6 is a cross-sectional view showing the structure of a nonvolatile semiconductor memory device according to a second background art.
Figure 7:
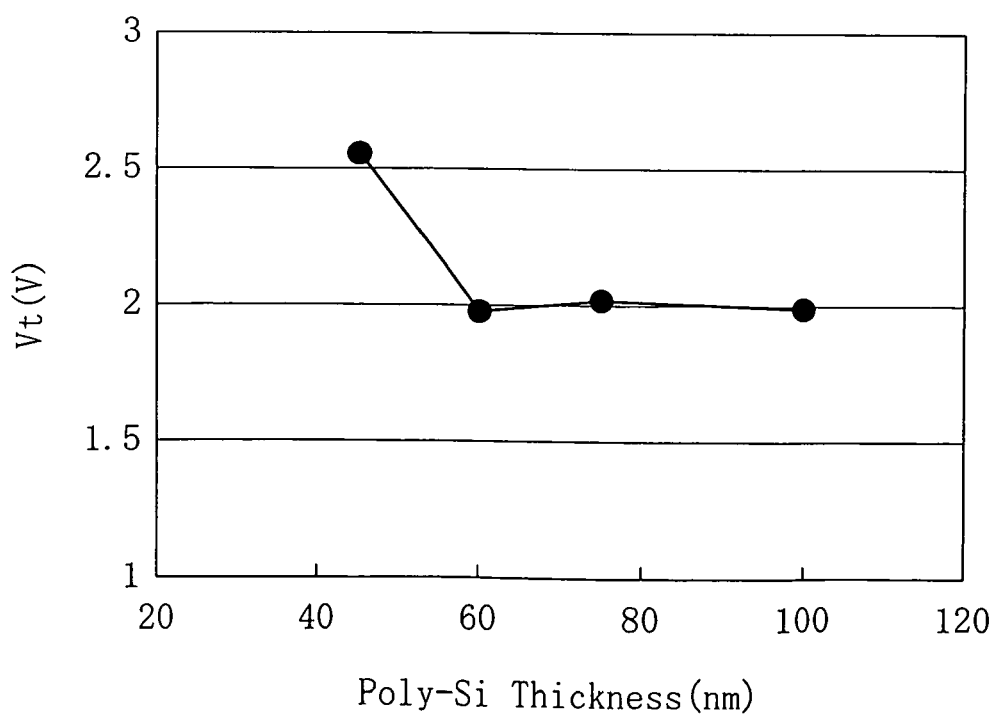
FIG. 7 is a graph showing the dependence of a threshold voltage of a memory cell on the thickness of a polycrystalline silicon film for a shield against ultraviolet light.

FIG. 4C is a cross-sectional view of another nonvolatile semiconductor memory device when, like FIG. 4B, a multilayer dielectric is formed only below the lateral end parts of the gate electrode opposed to source/drain diffusion regions and fixed charge accumulation regions are formed in the multilayer dielectric.

As shown in FIG. 4C, source/drain diffusion regions 42 are formed in the surface of the silicon substrate 41. A lower oxide film 43 is formed on the silicon substrate 41. A silicon nitride film 44 and an upper oxide film 45 are successively formed on the top surfaces of the lateral end parts of the lower oxide film 43. A polycrystalline silicon film 46 is formed on the lower oxide film 43 to cover the silicon nitride film 44 and the upper oxide film 45. In this modification, the source/drain diffusion regions 42 are formed below the lateral end parts of the gate electrode opposed to the source/drain diffusion regions 42 to overlap with the gate electrode by 60 nm or more in plan configuration.

Although in the above-mentioned first, second and third embodiments a description was given of the case where polycrystalline silicon is used as a material of the gate electrode, this material is not restrictive. For example, a multilayer film made of a metal material or polycrystalline silicon and another metal material can be used as a material of the gate electrode. In this case, the ultraviolet light absorbance varies with materials used for the gate electrode. Therefore, the necessary thickness of the gate electrode varies with the change in the ultraviolet light absorbance.

As seen from the above, when any of the nonvolatile semiconductor memory devices shown in FIGS. 4A through 4C is used, at least one source/drain diffusion region can be formed to overlap, in plan configuration, a fixed charge accumulation region of the multilayer dielectric and extend, in plan configuration, beyond the fixed charge accumulation regions toward the middle of a channel region existing between the source/drain diffusion regions. Therefore, the one or two fixed charge accumulation regions where electrons produced by the influence of ultraviolet light can be accumulated and regions of the multilayer dielectric in which writing/erasing operations are carried out are separated or partly overlap. Hence, as described above, the threshold voltage of the nonvolatile semiconductor memory device can easily be controlled with the influence of ultraviolet light eliminated. Accordingly, the nonvolatile semiconductor memory device can be operated normally.

As described above, the nonvolatile semiconductor memory device of the present invention and the method for fabricating the same can effectively suppress the influence of ultraviolet light on the accumulation of charges and are therefore useful when charges are to be discretely accumulated in a multilayer dielectric.

What is claimed is:

1. A nonvolatile semiconductor memory device comprising:
   a gate dielectric made of a multilayer dielectric that is formed on a substrate and discretely accumulates charges;
   a gate electrode formed on the gate dielectric;
   a pair of diffusion regions formed in the surface of the substrate with the gate electrode interposed therebetween and serving as a source and a drain; and
   a channel region existing between the diffusion regions,
   wherein at least one of regions of the gate dielectric located between the pair of diffusion regions and lateral end parts of the gate electrode opposed to the diffusion regions includes a fixed charge accumulation region in which charges produced by irradiating the gate electrode with ultraviolet light can be accumulated, and
   at least one said diffusion region located below the fixed charge accumulation region is formed to overlap with the fixed charge accumulation region in plan configuration and extend beyond the fixed charge accumulation region toward the middle of the channel region in plan configuration.

2. The nonvolatile semiconductor memory device of claim 1, wherein
   a region of the gate dielectric opposed to the vicinity of the interface between the channel region and the at least one diffusion region is a region thereof in which charges are accumulated by a writing operation or a region thereof in which charges to be extracted by an erasing operation are accumulated.

3. The nonvolatile semiconductor memory device of claim 1, wherein
   the at least one diffusion region located below the fixed charge accumulation region and the gate electrode overlap each other by 60 nm or more in plan configuration.

4. The nonvolatile semiconductor memory device of claim 1, wherein
   the gate dielectric is made of a multilayer film obtained by successively stacking a silicon oxide film, a silicon nitride film and a silicon oxide film.

5. The nonvolatile semiconductor memory device of claim 1, wherein
   the gate electrode is made of polycrystalline silicon and has a thickness of 60 nm or more.

* * * * *